(12) United States Patent
Hu

(10) Patent No.: US 11,228,417 B2
(45) Date of Patent: Jan. 18, 2022

(54) DATA SAMPLING CIRCUIT

(71) Applicant: CHANGXIN MEMORY TECHNOLOGIES, INC., Hefei (CN)

(72) Inventor: Jianfei Hu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 0 days.

(21) Appl. No.: 17/095,743

(22) Filed: Nov. 12, 2020

(65) Prior Publication Data

US 2021/0067309 A1 Mar. 4, 2021

Related U.S. Application Data

(63) Continuation of application No. PCT/CN2019/125745, filed on Dec. 16, 2019.

(30) Foreign Application Priority Data

Aug. 12, 2019 (CN) .......................... 201910741170.8

(51) Int. Cl.
*H04L 7/00* (2006.01)
*G11C 27/02* (2006.01)

(52) U.S. Cl.
CPC ............ *H04L 7/0016* (2013.01); *G11C 27/02* (2013.01)

(58) Field of Classification Search
CPC ......... H04L 7/0016; G11C 27/02; G11C 7/10; G06F 1/24; H03M 1/1245
See application file for complete search history.

(56) References Cited

U.S. PATENT DOCUMENTS

| | | | |
|---|---|---|---|
| 7,733,815 B2* | 6/2010 | Gopalakrishnan .. | H03M 1/1245 370/284 |
| 8,593,193 B1* | 11/2013 | Bazes .............. | H03K 3/356121 327/202 |
| 10,673,608 B2* | 6/2020 | Tajalli .................. | H04L 7/0045 |
| 2014/0029331 A1 | 1/2014 | Gopalakrishnan et al. | |
| 2015/0063008 A1 | 3/2015 | Moon et al. | |

FOREIGN PATENT DOCUMENTS

| | | |
|---|---|---|
| CN | 101782634 A | 7/2010 |
| CN | 203377849 U | 1/2014 |
| CN | 104113311 A | 10/2014 |
| CN | 109067210 A | 12/2018 |

* cited by examiner

*Primary Examiner* — Betsy Deppe
(74) *Attorney, Agent, or Firm* — Kilpatrick Townsend & Stockton LLP

(57) ABSTRACT

Various embodiments provide a data sampling circuit comprising a first sampling module configured to respond to a signal from the data signal terminal and a signal from the reference signal terminal and to act on the first node and the second node; a second sampling module configured to respond to the signal from the first node and the signal from the second node and to act on the third node and the fourth node; a latch module configured to input a high level to the first output terminal and input a low level to the second output terminal; and an offset compensation module connected in parallel to the second sampling module and configured to compensate an offset voltage of the second sampling module.

10 Claims, 2 Drawing Sheets

US 11,228,417 B2

DATA SAMPLING CIRCUIT

CROSS REFERENCE

The present disclosure is a continuation of PCT/CN2019/125745, filed on Dec. 16, 2019, which claims priority to Chinese Patent Application No. 201910741170.8, titled "DATA SAMPLING CIRCUIT" and filed on Aug. 12, 2019, the entire contents of which are incorporated herein by reference.

TECHNICAL FIELD

The present disclosure generally relates to the field of storage technologies, and more particularly, to a data sampling circuit.

BACKGROUND

In LPDDR4/5 (Low Power Double Data Rate 4/5, 4/5th generation low-power memory), as a rate of an input signal becomes faster and faster, an operating speed of a DQ data sampling circuit also needs to be increased accordingly.

In related technologies, the DQ data sampling circuit generally includes a sampling module and a latch module. The sampling module completes sampling of input data, and the latch module completes latch hold of sampled data. Meanwhile, because the sampling module may have an offset voltage, the DQ data sampling circuit also includes an offset compensation circuit, which is employed to compensate the sampling module.

However, a disadvantage of the sampling module is that kickback noise generated by the sampling module is relatively large, and the offset compensation circuit may further increase the kickback noise of the sampling module.

It is to be noted that the above information disclosed in this Background section is only for enhancement of understanding of the background of the present disclosure and therefore it may contain information that does not form the related art that is already known to a person of ordinary skill in the art.

SUMMARY

According to one aspect of the present disclosure, there is provided a data sampling circuit, which includes: a first sampling module, a second sampling module, a latch module, and an offset compensation module. The first sampling module is connected to a data signal terminal, a reference signal terminal, a first node and a second node, and is configured to respond to a signal from the data signal terminal and a signal from the reference signal terminal and to act on the first node and the second node. The second sampling module is connected to the first node, the second node, a third node and a fourth node, and is configured to respond to the signal from the first node and the signal from the second node and to act on the third node and the fourth node. The latch module is connected to the third node, the fourth node, a first output terminal and a second output terminal, and is configured to input a high-level signal to the first output terminal and input a low-level signal to the second output terminal, or input the low-level signal to the first output terminal and input the high-level signal to the second output terminal according to the signal from the third node and the signal from the fourth node. The offset compensation module is connected in parallel to the second sampling module, and is configured to compensate an offset voltage of the second sampling module.

In an exemplary embodiment, the first sampling module is further connected to a first clock signal terminal, and is configured to respond to a signal from the first clock signal terminal to initiate a sampling action. The data sampling circuit further includes a reset module.

The reset module is connected to the first clock signal terminal, a second clock signal terminal, the first node, the second node, the third node, the fourth node, the first output terminal and the second output terminal, and is configured to respond to the signal from the first clock signal terminal to reset the first node and the second node, and to respond to a signal from the second clock signal terminal to reset the third node, the fourth node, the first output terminal, and the second output terminal.

In an exemplary embodiment, the first sampling module includes: a first P-type transistor, a second P-type transistor, and a third P-type transistor. A first terminal of the first P-type transistor is connected to the high-level signal terminal, a control terminal of the first P-type transistor is connected to the first clock signal terminal, and a second terminal of the first P-type transistor is connected to a fifth node. A first terminal of the second P-type transistor is connected to the second terminal of the first P-type transistor, a control terminal of the second P-type transistor is connected to the data signal terminal, and a second terminal of the second P-type transistor is connected to the second node. A first terminal of the third P-type transistor is connected to the second terminal of the first P-type transistor, a control terminal of the third P-type transistor is connected to the reference voltage signal terminal, and a second terminal of the third P-type transistor is connected to the first node.

In an exemplary embodiment, the second sampling module includes a fourth N-type transistor and a fifth N-type transistor. A first terminal of the fourth N-type transistor is connected to the low-level signal terminal, a control terminal of the fourth N-type transistor is connected to the second node, and a second terminal of the fourth N-type transistor is connected to the third node. A first terminal of the fifth N-type transistor is connected to the low-level signal terminal, a control terminal of the fifth N-type transistor is connected to the first node, and a second terminal of the fifth N-type transistor is connected to the fourth node.

In an exemplary embodiment, the latch module includes a sixth P-type transistor, a seventh N-type transistor, an eighth P-type transistor, and a ninth N-type transistor. A first terminal of the sixth P-type transistor is connected to the high-level signal terminal, a control terminal of the sixth P-type transistor is connected to the second output terminal, and a second terminal of the sixth P-type transistor is connected to the first output terminal. A first terminal of the seventh N-type transistor is connected to the third node, a second terminal of the seventh N-type transistor is connected to the first output terminal, and a control terminal of the seventh N-type transistor is connected to the second output terminal. A first terminal of the eighth P-type transistor is connected to the high-level signal terminal, a control terminal of the eighth P-type transistor is connected to the first output terminal, and a second terminal of the eighth P-type transistor is connected to the second output terminal. A first terminal of the ninth N-type transistor is connected to the fourth node, a second terminal of the ninth N-type transistor is connected to the second output terminal, and a control terminal of the ninth N-type transistor is connected to the first output terminal.

In an exemplary embodiment, the offset compensation module includes a first offset compensation module. The first offset compensation module is connected in parallel to two terminals of the fourth N-type transistor, and is configured to compensate a parameter of the fourth N-type transistor.

In an exemplary embodiment, the first offset compensation module includes a tenth N-type transistor, an eleventh transistor, a twelfth N-type transistor, and a thirteenth transistor. A first terminal of the tenth N-type transistor is connected to the third node, and a control terminal of the tenth N-type transistor is connected to the second node. A first terminal of the eleventh transistor is connected to the low-level signal terminal, a second terminal of the eleventh transistor is connected to a second terminal of the tenth N-type transistor, and a control terminal of the eleventh transistor is connected to a first control signal terminal. A first terminal of the twelfth N-type transistor is connected to the third node, and a control terminal of the twelfth N-type transistor is connected to the second node. A first terminal of the thirteenth transistor is connected to the low-level signal terminal, a second terminal of the thirteenth transistor is connected to a second terminal of the twelfth N-type transistor, and a control terminal of the thirteenth transistor is connected to a second control signal terminal. In an exemplary embodiment of the present disclosure, the offset compensation module further includes a second offset compensation module. The second offset compensation module is connected in parallel to two terminals of the fifth N-type transistor, and is configured to compensate a parameter of the fifth N-type transistor.

In an exemplary embodiment of the present disclosure, the second offset compensation module includes a fourteenth N-type transistor, a fifteenth transistor, a sixteenth N-type transistor, and a seventeenth transistor. A first terminal of the fourteenth N-type transistor is connected to the fourth node, and a control terminal of the fourteenth N-type transistor is connected to the first node. A first terminal of the fifteenth transistor is connected to the low-level signal terminal, a second terminal of the fifteenth transistor is connected to a second terminal of the fourteenth N-type transistor, and a control terminal of the fifteenth transistor is connected to a third control signal terminal. A first terminal of the sixteenth N-type transistor is connected to the fourth node, and a control terminal of the sixteenth N-type transistor is connected to the first node. A first terminal of the seventeenth transistor is connected to the low-level signal terminal, a second terminal of the seventeenth transistor is connected to a second terminal of the sixteenth N-type transistor, and a control terminal of the seventeenth transistor is connected to a fourth control signal terminal.

In an exemplary embodiment of the present disclosure, the reset module includes an eighteenth N-type transistor, a nineteenth N-type transistor, a twentieth P-type transistor, a twenty-first P-type transistor, a twenty-second P-type transistor, and a twenty-third P-type transistor. A first terminal of the eighteenth N-type transistor is connected to the low-level signal terminal, a second terminal of the eighteenth N-type transistor is connected to the second node, and a control terminal of the eighteenth N-type transistor is connected to the first clock signal terminal. A first terminal of the nineteenth N-type transistor is connected to the low-level signal terminal, a second terminal of the nineteenth N-type transistor is connected to the first node, and a control terminal of the nineteenth N-type transistor is connected to the first clock signal terminal. A first terminal of the twentieth P-type transistor is connected to the high-level signal terminal, a second terminal of the twentieth P-type transistor is connected to the third node, and a control terminal of the twentieth P-type transistor is connected to the second clock signal terminal. A first terminal of the twenty-first P-type transistor is connected to the high-level signal terminal, a second terminal of the twenty-first P-type transistor is connected to the first output terminal, and a control terminal of the twenty-first P-type transistor is connected to the second clock signal terminal. A first terminal of the twenty-second P-type transistor is connected to the high-level signal terminal, a second terminal of the twenty-second P-type transistor is connected to the second output terminal, and a control terminal of the twenty-second P-type transistor is connected to the second clock signal terminal. A first terminal of the twenty-third P-type transistor is connected to the high-level signal terminal, a second terminal of the twenty-third P-type transistor is connected to the fourth node, and a control terminal of the twenty-third P-type is connected to the second clock signal terminal.

It is to be understood that the above general description and the detailed description below are merely exemplary and explanatory, and do not limit the present disclosure.

BRIEF DESCRIPTION OF THE DRAWINGS

The accompanying drawings herein are incorporated in and constitute a part of this specification, illustrate embodiments conforming to the present disclosure and, together with the description, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

The exemplary embodiment will now be described more fully with reference to the accompanying drawings. However, the exemplary embodiments can be implemented in a variety of forms and should not be construed as limiting. Rather, the embodiments are provided so that the present disclosure will be thorough and complete and will fully convey the concepts of exemplary embodiments to those skilled in the art. Throughout the drawings, similar reference signs indicate the same or similar structures, and their detailed description will be omitted.

Although relativity terms such as "above" and "below" are used herein to describe a relative relation between one component and another component of icons, these terms are merely for convenience herein, for example, the directions of the examples in the accompanying drawings. It is to be understood that when the apparatus of the icon is turned upside down, components described as "above" will become components described as "below". Other relative terms such as "high", "low", "top", "bottom", "left", "right" and so on also have similar meanings. When a certain structure is "above" other structures, it likely means that a certain structure is integrally formed on other structures, or a certain structure is "directly" arranged on other structures, or a certain structure is "indirectly" arranged on other structures by means of another structure.

The terms "one", "a" and "the" are intended to mean that there exists one or more elements/constituent parts/etc. The terms "comprising" and "having" are intended to be inclusive and mean that there may be additional elements/constituent parts/etc. other than the listed elements/constituent parts/etc.

Figure 1:
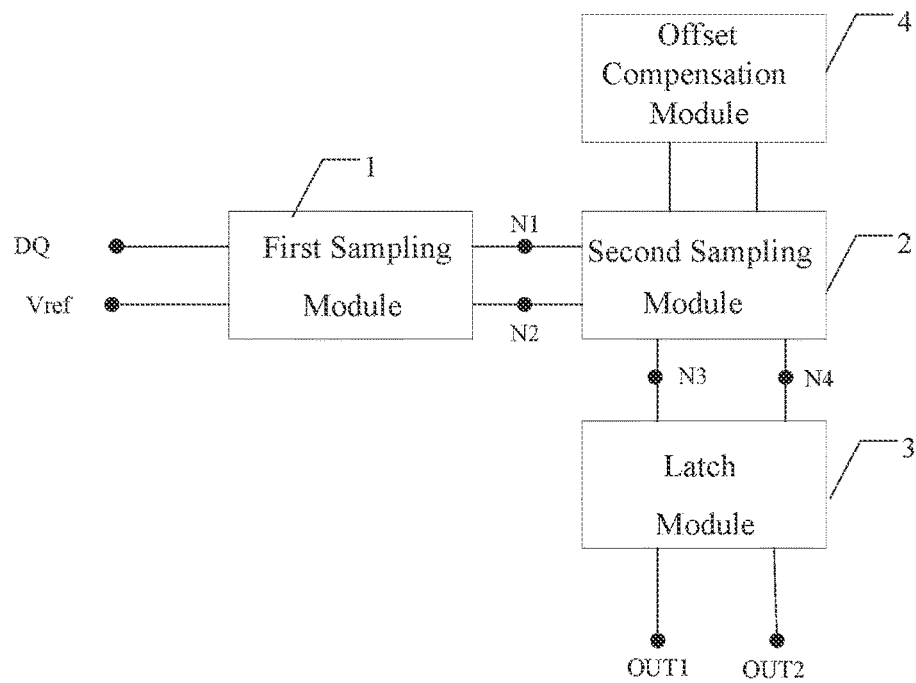
FIG. 1 is a schematic structural diagram of a data sampling circuit according to an exemplary embodiment of the present disclosure.

This exemplary embodiment provides a data sampling circuit. As shown in FIG. 1, a schematic structural diagram of a data sampling circuit according to an exemplary embodiment of the present disclosure is illustrated. The data sampling circuit includes a first sampling module 1, a second sampling module 2, a latch module 3, and an offset compensation module 4. The first sampling module is connected to a data signal terminal DQ, a reference voltage signal terminal Vref, a first node N1 and a second node N2, and is configured to respond to a signal from the data signal terminal and a signal from the reference signal terminal and to act on the first node and the second node. The second sampling module is connected to the first node N1, the second node N2, a third node N3 and a fourth node N4, and is configured to respond to the signal from the first node and the signal from the second node and to act on the third node and the fourth node. The latch module is connected to the third node N3, the fourth node N4, a first output terminal OUT1 and a second output terminal OUT2, and is configured to input a high-level signal to the first output terminal and input a low-level signal to the second output terminal, or input the low-level signal to the first output terminal and input the high-level signal to the second output terminal according to the signal from the third node and the signal from the fourth node. The offset compensation module is connected in parallel to the second sampling module, and is configured to compensate an offset voltage of the second sampling module. The first sampling module is configured to respond to a signal from the data signal terminal and a signal from the reference signal terminal and to act on the first node and the second node, which specifically may refer to a fact that the first sampling module writes corresponding voltage to the first node and the second node according to the signal from the data signal terminal and the signal from the reference signal terminal. The second sampling module is configured to respond to the signal from the first node and the signal from the second node and to act on the third node and the fourth node, which specifically may refer to a fact that the second sampling module writes corresponding voltage to the third node and the fourth node according to the signal from the first node and the signal from the second node.

In this data sampling circuit, the second sampling module is additionally provided, and the offset compensation module is connected in parallel to the second sampling module, such that kickback noise of the data signal terminal and kickback noise of the reference voltage signal terminal generated by the first output terminal and the second output terminal are reduced.

Figure 2:
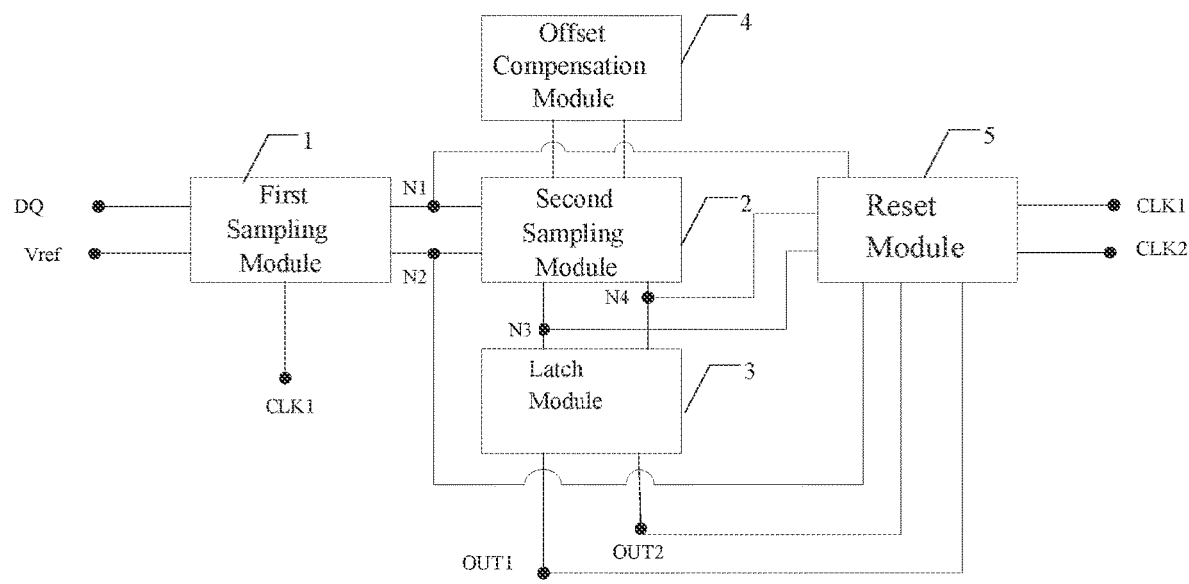
FIG. 2 is a schematic structural diagram of a data sampling circuit according to another exemplary embodiment of the present disclosure.

In this exemplary embodiment, as shown in FIG. 2, a schematic structural diagram of a data sampling circuit according to another exemplary embodiment of the present disclosure is illustrated. The first sampling module is further connected to a first clock signal terminal CLK1, and is configured to respond to a signal from the first clock signal terminal to initiate a sampling action. The data sampling circuit further includes a reset module 5. The reset module 5 is connected to the first clock signal terminal CLK1, a second clock signal terminal CLK2, the first node N1, the second node N2, the third node N3, the fourth node N4, the first output terminal OUT1 and the second output terminal OUT2, and is configured to respond to the signal from the first clock signal terminal to reset the first node and the second node, and to respond to a signal from the second clock signal terminal to reset the third node, the fourth node, the first output terminal, and the second output terminal.

Figure 3:
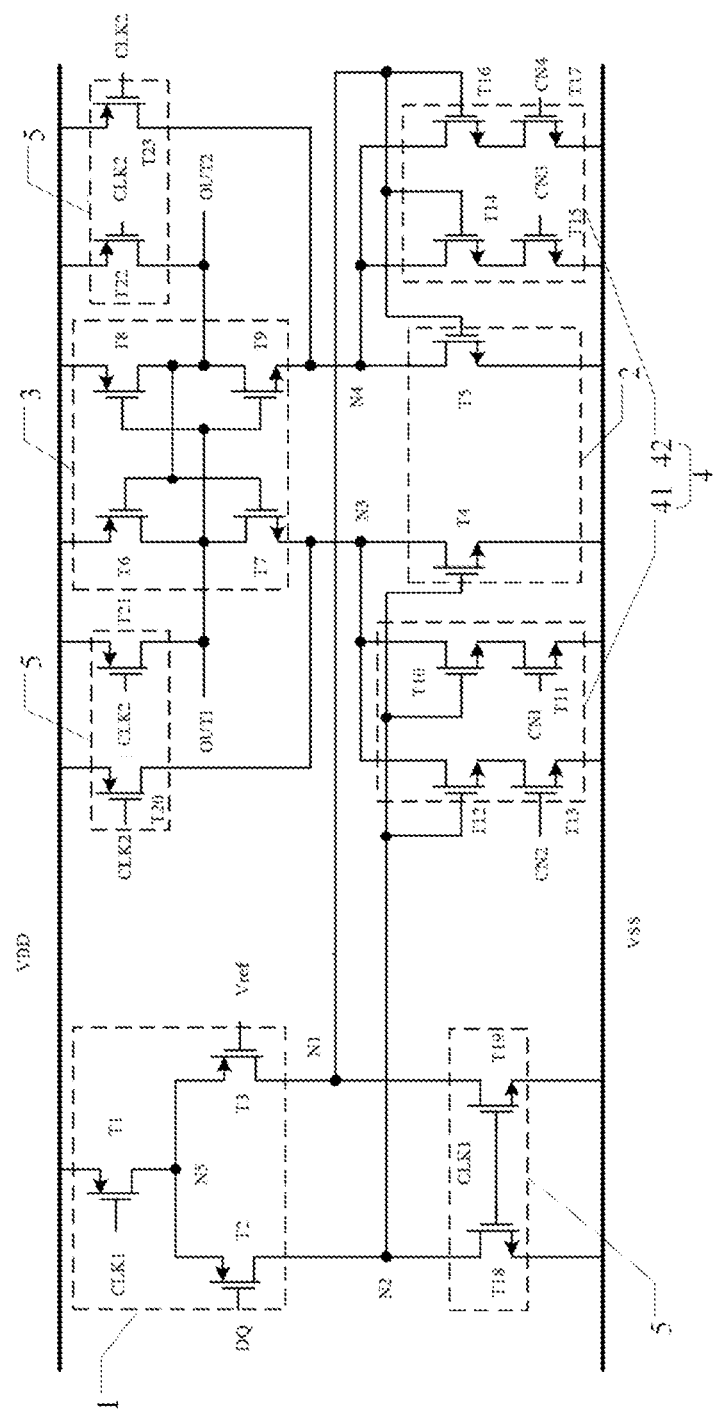
FIG. 3 is a schematic structural diagram of a data sampling circuit according to still another exemplary embodiment of the present disclosure.

In this exemplary embodiment, as shown in FIG. 3, a schematic structural diagram of a data sampling circuit according to still another exemplary embodiment of the present disclosure is illustrated. The first sampling module 1 may include a first P-type transistor T1, a second P-type transistor T2, and a third P-type transistor T3. A first terminal of the first P-type transistor T1 is connected to the high-level signal terminal VDD, and a control terminal of the first P-type transistor T1 is connected to the first clock signal terminal CLK1. A first terminal of the second P-type transistor T2 is connected to a second terminal of the first P-type transistor T1, a control terminal of the second P-type transistor T2 is connected to the data signal terminal DQ, and a second terminal of the second P-type transistor T2 is connected to the second node N2. A first terminal of the third P-type transistor T3 is connected to the second terminal of the first P-type transistor T1, a control terminal of the third P-type transistor T3 is connected to the reference voltage signal terminal Vref, and a second terminal of the third P-type transistor T3 is connected to the first node N1. It is to be understood that in other exemplary embodiments, there are more alternative structures for the first sampling module, which falls within the protection scope of the present disclosure.

In this exemplary embodiment, as shown in FIG. 3, the second sampling module 2 may include a fourth N-type transistor T4 and a fifth N-type transistor T5. A first terminal of the fourth N-type transistor T4 is connected to the low-level signal terminal VSS, a control terminal of the fourth N-type transistor T4 is connected to the second node N2, and a second terminal of the fourth N-type transistor T4 is connected to the third node N3. A first terminal of the fifth N-type transistor T5 is connected to the low-level signal terminal VSS, a control terminal of the fifth N-type transistor T5 is connected to the first node N1, and a second terminal of the fifth N-type transistor T5 is connected to the fourth node N4. It is to be understood that in other exemplary embodiments, there are more alternative structures for the second sampling module, which falls within the protection scope of the present disclosure.

In this exemplary embodiment, as shown in FIG. 3, the latch module 3 may include a sixth P-type transistor T6, a seventh N-type transistor T7, an eighth P-type transistor T8, and a ninth N-type transistor T9. A first terminal of the sixth P-type transistor T6 is connected to the high-level signal terminal VDD, a control terminal of the sixth P-type transistor T6 is connected to the second output terminal OUT2, and a second terminal of the sixth P-type transistor T6 is connected to the first output terminal OUT1. A first terminal of the seventh N-type transistor T7 is connected to the third node N3, a second terminal of the seventh N-type transistor T7 is connected to the first output terminal OUT1, and a control terminal of the seventh N-type transistor T7 is connected to the second output terminal OUT2. A first terminal of the eighth P-type transistor T8 is connected to the high-level signal terminal VDD, a control terminal of the eighth P-type transistor T8 is connected to the first output terminal OUT1, and a second terminal of the eighth P-type transistor T8 is connected to the second output terminal OUT2. A first terminal of the ninth N-type transistor T9 is connected to the fourth node N4, a second terminal of the ninth N-type transistor T9 is connected to the second output terminal OUT2, and a control terminal of the ninth N-type transistor T9 is connected to the first output terminal OUT1.

In this exemplary embodiment, as shown in FIG. 3, the offset compensation module 4 may include a first offset compensation module 41. The first offset compensation module 41 is connected in parallel to two terminals of the fourth N-type transistor T4, and is configured to compensate a parameter of the fourth N-type transistor T4.

In this exemplary embodiment, as shown in FIG. 3, the first offset compensation module 41 may include a tenth N-type transistor T10, an eleventh transistor T11, a twelfth N-type transistor T12, and a thirteenth transistor T13. A first terminal of the tenth N-type transistor T10 is connected to the third node N3, and a control terminal of the tenth N-type transistor T10 is connected to the second node N2. A first terminal of the eleventh transistor T11 is connected to the low-level signal terminal VSS, a second terminal of the eleventh transistor T11 is connected to a second terminal of the tenth N-type transistor T10, and a control terminal of the eleventh transistor T11 is connected to a first control signal terminal CN1. A first terminal of the twelfth N-type transistor T12 is connected to the third node N3, and a control terminal of the twelfth N-type transistor T12 is connected to the second node N2. A first terminal of the thirteenth transistor T13 is connected to the low-level signal terminal VSS, a second terminal of the thirteenth transistor T13 is connected to a second terminal of the twelfth N-type transistor T12, and a control terminal of the thirteenth transistor T13 is connected to a second control signal terminal CN2. The thirteenth transistor T13 may connect the twelfth N-type transistor T12 in parallel to two terminals of the fourth N-type transistor T4 in response to the signal from the second control signal terminal CN2, and the eleventh transistor T11 may connect the tenth N-type transistor T10 in parallel to the two terminals of the fourth N-type transistor T4 in response to the signal from the first control signal terminal CN1, so as to implement the compensation of the parameter of the fourth N-type transistor T4. The eleventh transistor T11 and the thirteenth transistor T13 may be N-type transistors or P-type transistors. It is to be understood that in other exemplary embodiments, there are more alternative structures for the first offset compensation module 41. For example, the first offset compensation module 41 may further include more transistors connected in parallel to the fourth N-type transistor T4.

In this exemplary embodiment, as shown in FIG. 3, the offset compensation module 4 may further include a second offset compensation module 42. The second offset compensation module 42 is connected in parallel to two terminals of the fifth N-type transistor T5, and is configured to compensate a parameter of the fifth N-type transistor T5.

In this exemplary embodiment, the second offset compensation module 42 may include a fourteenth N-type transistor T14, a fifteenth transistor T15, a sixteenth N-type transistor T16, and a seventeenth transistor T17. A first terminal of the fourteenth N-type transistor T14 is connected to the fourth node N4, and a control terminal of the fourteenth N-type transistor T14 is connected to the first node N1. A first terminal of the fifteenth transistor T15 is connected to the low-level signal terminal VSS, a second terminal of the fifteenth transistor T15 is connected to a second terminal of the fourteenth N-type transistor T14, and a control terminal of the fifteenth transistor T15 is connected to a third control signal terminal CN3. A first terminal of the sixteenth N-type transistor T16 is connected to the fourth node N4, and a control terminal of the sixteenth N-type transistor T16 is connected to the first node N1. A first terminal of the seventeenth transistor T17 is connected to the low-level signal terminal VSS, a second terminal of the seventeenth transistor T17 is connected to a second terminal of the sixteenth N-type transistor T16, and a control terminal of the seventeenth transistor T17 is connected to a fourth control signal terminal CN4. The fifteenth transistor T15 may connect the fourteenth N-type transistor T14 in parallel to two terminals of the fifth N-type transistor T5 in response to a signal from the third control signal terminal CN3, and the seventeenth transistor T17 may connect the sixteenth N-type transistor T16 in parallel to the two terminals of the fifth N-type transistor T5 in response to a signal from the fourth control signal terminal CN4, so as to implement the compensation of the parameter of the fifth N-type transistor T5. The fifteenth transistor T15 and the seventeenth transistor T17 may be N-type transistors or P-type transistors. It is to be understood that in other exemplary embodiments, there are more alternative structures for the second offset compensation module 42. For example, the second offset compensation module 42 may further include more transistors connected in parallel to the fifth N-type transistor T5.

In this exemplary embodiment, as shown in FIG. 3, the reset module 5 may include an eighteenth N-type transistor T18, a nineteenth N-type transistor T19, a twentieth P-type transistor T20, a twenty-first P-type transistor T21, a twenty-second P-type transistor T22, and a twenty-third P-type transistor T23. A first terminal of the eighteenth N-type transistor T18 is connected to the low-level signal terminal T22, a second terminal of the eighteenth N-type transistor T18 is connected to the second node N2, and a control terminal of the eighteenth N-type transistor T18 is connected to the first clock signal terminal CLK1. A first terminal of the nineteenth N-type transistor T19 is connected to the low-level signal terminal VSS, a second terminal of the nineteenth N-type transistor T19 is connected to the first node N1, and a control terminal of the nineteenth N-type transistor T19 is connected to the first clock signal terminal CLK1. A first terminal of the twentieth P-type transistor T20 is connected to the high-level signal terminal VDD, a second terminal of the twentieth P-type transistor T20 is connected to the third node N3, and a control terminal of the twentieth P-type transistor T20 is connected to the second clock signal terminal CLK2. A first terminal of the twenty-first P-type transistor T21 is connected to the high-level signal terminal VDD, a second terminal of the twenty-first P-type transistor T21 is connected to the first output terminal OUT1, and a control terminal of the twenty-first P-type transistor is connected to the second clock signal terminal CLK2. A first terminal of the twenty-second P-type transistor T22 is connected to the high-level signal terminal VDD, a second terminal of the twenty-second P-type transistor T22 is connected to the second output terminal OUT2, and a control terminal of the twenty-second P-type transistor T22 is connected to the second clock signal terminal CLK2. A first terminal of the twenty-third P-type transistor T23 is connected to the high-level signal terminal VDD, a second terminal of the twenty-third P-type transistor T23 is connected to the fourth node N4, and a control terminal of the twenty-third P-type transistor T23 is connected to the second clock signal terminal CLK2.

A working process of the data sampling circuit provided by this exemplary embodiment is divided into four phases: a reset phase, a first sampling phase, a second sampling phase, and a latch phase.

In the reset phase, the first clock signal terminal CLK1 is at a high level, the second clock signal terminal CLK2 is at a low level, and the eighteenth N-type transistor T18 and the nineteenth N-type transistor T19 are enabled. The first node N1 and the second node N2 are at low levels. The twentieth P-type transistor T20, the twenty-first P-type transistor T21, the twenty-second P-type transistor T22 and the twenty-third P-type transistor T23 are enabled. The third node N3, the fourth node N4, the first output terminal OUT1 and the second output terminal OUT2 are at high levels.

In the first sampling phase, the first clock signal terminal CLK1 is at a low level, and the second clock signal terminal CLK2 is at a high level. The eighteenth N-type transistor T18 and the nineteenth N-type transistor T19 are disabled. The twentieth P-type The transistor T20, the twenty-first P-type transistor T21, the twenty-second P-type transistor T22 and the twenty-third P-type transistor T23 are disabled. In the meantime, the first P-type transistor T1 is enabled, the second P-type transistor T2 charges the second node under the action of the signal from the data signal terminal DQ, and the third P-type transistor T3 charges the first node under the action of the signal from the reference voltage signal terminal Vref. This phase lasts until the fourth N-type transistor T4 or the fifth N-type transistor T5 is first enabled. For example, when a voltage across the data signal terminal DQ is less than a voltage across the reference voltage signal terminal Vref, the fourth N-type transistor T4 is first enabled.

In the second sampling phase, reference is made by taking an example where the voltage across the data signal terminal DQ is less than the voltage across the reference voltage signal terminal Vref. After the fourth N-type transistor T4 is first enabled, the third node is discharged until the seventh N-type transistor T7 is first enabled.

In the latch phase, after the seventh N-type transistor T7 is enabled, the first output terminal OUT1 is set at a low level. In the meanwhile, the eighth P-type transistor T8 is enabled under the action of the first output terminal OUT1, such that the second output terminal OUT2 is set at a high level.

Similarly, when the voltage across the data signal terminal DQ is greater than the voltage across the reference voltage signal terminal Vref, the first output terminal OUT1 is set at a high level, and the second output terminal OUT2 is set at a low level.

In this exemplary embodiment, the data sampling circuit has 3 transistors stacked (connected in series) at most. Compared with a data sampling circuit in the related art, this data sampling circuit can work at a lower voltage and at a higher speed. Moreover, the second sampling module is composed of the fourth N-type transistor T4 and the fifth N-type transistor T5. Both a threshold voltage and a carrier speed of the N-type transistor are much greater than those of the P-type transistor. That is, the N-type transistor works faster than the P-type transistor. Furthermore, a substrate and a source of the N-type transistor are connected, and thus there is no substrate bias effect, such that the threshold voltage of the transistor can be minimized during operation, and thus the speed of the data sampling circuit can be greatly improved.

Other embodiments will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What claimed is:

1. A data sampling circuit comprising:
  a first sampling circuit connected to a data signal terminal, a reference signal terminal, a first node and a second node, the first sampling circuit being configured to respond to a signal from the data signal terminal and a signal from the reference signal terminal and to act on the first node and the second node;
  a second sampling circuit connected to the first node, the second node, a third node and a fourth node, the second sampling circuit being configured to respond to the signal from the first node and the signal from the second node and to act on the third node and the fourth node;
  a latch circuit connected to the third node, the fourth node, a first output terminal and a second output terminal, the latch circuit being configured to input a high-level signal to the first output terminal and input a low-level signal to the second output terminal, or to input the low-level signal to the first output terminal and input the high-level signal to the second output terminal according to the signal from the third node and the signal from the fourth node; and
  an offset compensation circuit connected in parallel to the second sampling circuit, the offset compensation circuit being configured to compensate an offset voltage of the second sampling circuit.

2. The data sampling circuit according to claim 1, wherein the first sampling circuit is further connected to a first clock signal terminal, and is configured to respond to a signal from the first clock signal terminal to initiate a sampling action; and, wherein the data sampling circuit further comprises:
  a reset circuit connected to the first clock signal terminal, a second clock signal terminal, the first node, the second node, the third node, the fourth node, the first output terminal and the second output terminal and configured to respond to the signal from the first clock signal terminal to reset the first node and the second node, and to respond to a signal from the second clock signal terminal to reset the third node, the fourth node, the first output terminal, and the second output terminal.

3. The data sampling circuit according to claim 2, wherein the first sampling circuit comprises:
  a first P-type transistor, a first terminal of the first P-type transistor being connected to a high-level signal terminal, a control terminal of the first P-type transistor being connected to the first clock signal terminal, and a second terminal of the first P-type transistor being connected to a fifth node;
  a second P-type transistor, a first terminal of the second P-type transistor being connected to the second terminal of the first P-type transistor, a control terminal of the second P-type transistor being connected to the data signal terminal, and a second terminal of the second P-type transistor being connected to the second node; and a third P-type transistor, a first terminal of the third P-type transistor being connected to the second terminal of the first P-type transistor, a control terminal of the third P-type transistor being connected to the reference signal terminal, and a second terminal of the third P-type transistor being connected to the first node.

4. The data sampling circuit according to claim 2, wherein the second sampling circuit comprises:

a fourth N-type transistor, a first terminal of the fourth N-type transistor being connected to a low-level signal terminal, a control terminal of the fourth N-type transistor being connected to the second node, and a second terminal of the fourth N-type transistor being connected to the third node; and a fifth N-type transistor, a first terminal of the fifth N-type transistor being connected to the low-level signal terminal, a control terminal of the fifth N-type transistor being connected to the first node, and a second terminal of the fifth N-type transistor being connected to the fourth node.

5. The data sampling circuit according to claim 2, wherein the latch circuit comprises:

a sixth P-type transistor, a first terminal of the sixth P-type transistor being connected to a high-level signal terminal, a control terminal of the sixth P-type transistor being connected to the second output terminal, and a second terminal of the sixth P-type transistor being connected to the first output terminal;

a seventh N-type transistor, a first terminal of the seventh N-type transistor being connected to the third node, a second terminal of the seventh N-type transistor being connected to the first output terminal, and a control terminal of the seventh N-type transistor being connected to the second output terminal;

an eighth P-type transistor, a first terminal of the eighth P-type transistor being connected to the high-level signal terminal, a control terminal of the eighth P-type transistor being connected to the first output terminal, and a second terminal of the eighth P-type transistor being connected to the second output terminal; and a ninth N-type transistor, a first terminal of the ninth N-type transistor being connected to the fourth node, a second terminal of the ninth N-type transistor being connected to the second output terminal, and a control terminal of the ninth N-type transistor being connected to the first output terminal.

6. The data sampling circuit according to claim 4, wherein the offset compensation circuit comprises:

a first offset compensation circuit connected in parallel to two terminals of the fourth N-type transistor and configured to compensate a parameter of the fourth N-type transistor.

7. The data sampling circuit according to claim 6, wherein the first offset compensation circuit comprises:

a tenth N-type transistor, a first terminal of the tenth N-type transistor being connected to the third node, and a control terminal of the tenth N-type transistor being connected to the second node;

an eleventh transistor, a first terminal of the eleventh transistor being connected to the low-level signal terminal, a second terminal of the eleventh transistor being connected to a second terminal of the tenth N-type transistor, and a control terminal of the eleventh transistor being connected to a first control signal terminal;

a twelfth N-type transistor, a first terminal of the twelfth N-type transistor being connected to the third node, and a control terminal of the twelfth N-type transistor being connected to the second node; and a thirteenth transistor, a first terminal of the thirteenth transistor being connected to the low-level signal terminal, a second terminal of the thirteenth transistor being connected to a second terminal of the twelfth N-type transistor, and a control terminal of the thirteenth transistor being connected to a second control signal terminal.

8. The data sampling circuit according to claim 7, wherein the offset compensation circuit further comprises a second offset compensation circuit connected in parallel to two terminals of the fifth N-type transistor and configured to compensate a parameter of the fifth N-type transistor.

9. The data sampling circuit according to claim 8, wherein the second offset compensation circuit comprises:

a fourteenth N-type transistor, a first terminal of the fourteenth N-type transistor being connected to the fourth node, and a control terminal of the fourteenth N-type transistor being connected to the first node;

a fifteenth transistor, a first terminal of the fifteenth transistor being connected to the low-level signal terminal, a second terminal of the fifteenth transistor being connected to a second terminal of the fourteenth N-type transistor, and a control terminal of the fifteenth transistor being connected to a third control signal terminal;

a sixteenth N-type transistor, a first terminal of the sixteenth N-type transistor being connected to the fourth node, and a control terminal of the sixteenth N-type transistor being connected to the first node; and a seventeenth transistor, a first terminal of the seventeenth transistor being connected to the low-level signal terminal, a second terminal of the seventeenth transistor being connected to a second terminal of the sixteenth N-type transistor, and a control terminal of the seventeenth transistor being connected to a fourth control signal terminal.

10. The data sampling circuit according to claim 2, wherein the reset circuit comprises:

an eighteenth N-type transistor, a first terminal of the eighteenth N-type transistor being connected to a low-level signal terminal, a second terminal of the eighteenth N-type transistor being connected to the second node, and a control terminal of the eighteenth N-type transistor being connected to the first clock signal terminal;

a nineteenth N-type transistor, a first terminal of the nineteenth N-type transistor being connected to the low-level signal terminal, a second terminal of the nineteenth N-type transistor being connected to the first node, and a control terminal of the nineteenth N-type transistor being connected to the first clock signal terminal;

a twentieth P-type transistor, a first terminal of the twentieth P-type transistor being connected to a high-level signal terminal, a second terminal of the twentieth P-type transistor being connected to the third node, and a control terminal of the twentieth P-type transistor being connected to the second clock signal terminal;

a twenty-first P-type transistor, a first terminal of the twenty-first P-type transistor being connected to the high-level signal terminal, a second terminal of the twenty-first P-type transistor being connected to the first output terminal, and a control terminal of the twenty-first P-type transistor being connected to the second clock signal terminal;

a twenty-second P-type transistor, a first terminal of the twenty-second P-type transistor being connected to the high-level signal terminal, a second terminal of the twenty-second P-type transistor being connected to the second output terminal, and a control terminal of the twenty-second P-type transistor being connected to the second clock signal terminal; and a twenty-third P-type transistor, a first terminal of the twenty-third P-type transistor being connected to the high-level signal terminal, a second terminal of the twenty-third P-type transistor being connected to the fourth node, and a control terminal of the twenty-third P-type being connected to the second clock signal terminal.

* * * * *